(12) United States Patent
Ohbuchi (10) Patent No.: US 6,611,542 B2
(45) Date of Patent: Aug. 26, 2003

(54) SEMICONDUCTOR LASER ELEMENT AND METHOD OF PRODUCING THE SAME

(75) Inventor: Syuzo Ohbuchi, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/994,647

(22) Filed: Nov. 28, 2001

(65) Prior Publication Data

US 2002/0067751 A1 Jun. 6, 2002

(30) Foreign Application Priority Data

Nov. 28, 2000 (JP) ........................................ 2000-360583

(51) Int. Cl.$^7$ ................................................ H01S 5/00
(52) U.S. Cl. ............................ 372/43; 385/49; 372/64
(58) Field of Search ........................... 372/43, 5, 64; 385/49

(56) References Cited

U.S. PATENT DOCUMENTS

| | | | | |
|---|---|---|---|---|
| 5,551,584 A | * | 9/1996 | Hisa ............................... | 216/2 |
| 5,854,867 A | * | 12/1998 | Lee et al. ........................ | 385/49 |
| 5,906,753 A | * | 5/1999 | Aoyagi et al. .................. | 216/24 |
| 6,217,231 B1 | * | 4/2001 | Mesaki et al. .................. | 385/88 |
| 6,385,223 B1 | * | 5/2002 | Kurihara ......................... | 372/43 |
| 6,456,767 B2 | * | 9/2002 | Terashima ....................... | 385/49 |
| 2001/0028768 A1 | * | 10/2001 | Terashima ....................... | 385/49 |
| 2002/0089913 A1 | * | 7/2002 | Moriyama et al. ............. | 369/53.26 |

FOREIGN PATENT DOCUMENTS

| | | |
|---|---|---|
| JP | B2 2677708 | 7/1997 |
| JP | A 11-121517 | 4/1999 |
| JP | A 8-55770 | 2/2001 |
| JP | A 2001-74670 | 3/2001 |
| JP | A 2001-77421 | 3/2001 |
| JP | A 2001-203424 | 7/2001 |

* cited by examiner

Primary Examiner—Paul Ip
Assistant Examiner—Dung T Nguyen
(74) Attorney, Agent, or Firm—Birch, Stewart, Kolasch & Birch, LLP (57) ABSTRACT

In a semiconductor laser element having a semiconductor substrate, and a crystal layer formed on a main surface of the semiconductor substrate, the crystal layer having in its inside a waveguide, a light-emitting point alignment mark is provided on an intersection line of an electrode surface of the semiconductor laser element with a plane which includes the waveguide and which is perpendicular to the electrode surface. The light-emitting point alignment mark having a length in a width direction of the semiconductor laser element of not more than 20 μm. A visually recognizable direction indicating mark is also provided on the same side as the light-emitting point alignment mark in a direction in which the waveguide extends.

5 Claims, 6 Drawing Sheets

SEMICONDUCTOR LASER ELEMENT AND METHOD OF PRODUCING THE SAME

BACKGROUND OF THE INVENTION

The present invention relates to a semiconductor laser element required for optical information processing such as in an optical fiber communication system, an optical measurement system, or an optical disk system, and a method of producing the same. In particular, the present invention relates to a semiconductor laser element suitable for producing a semiconductor laser device having a plurality of laser chips packaged together.

Semiconductor laser devices are used for optical communications, optical measurement systems, optical disc systems and the like. In particular, the market in the field of optical discs has been remarkably expanding and various kinds of optical discs, such as CD, MD, DVD, have come to be used for data preservation for computers and the like. These circumstances require semiconductor lasers having oscillation wavelengths in various wavelength regions including an infrared region, red region and further a blue region in future.

In order to record/reproduce signals to/from various kinds of optical discs using only one optical disc system, it is required that a semiconductor device having various kinds of oscillation wavelengths be packaged in the optical disc system. A semiconductor laser device is constructed by mounting a semiconductor laser element on a mount called stem and packaging it in one container. In order to realize a semiconductor laser device that achieves various kinds of oscillation wavelengths, it is required to use a so-called monolithic type semiconductor laser device wherein a semiconductor laser element having two or more laser resonators is mounted on a stem, or to use a so-called hybrid type semiconductor laser device in which two or more semiconductor laser elements are mounted close to each other on a stem.

Figure 7:
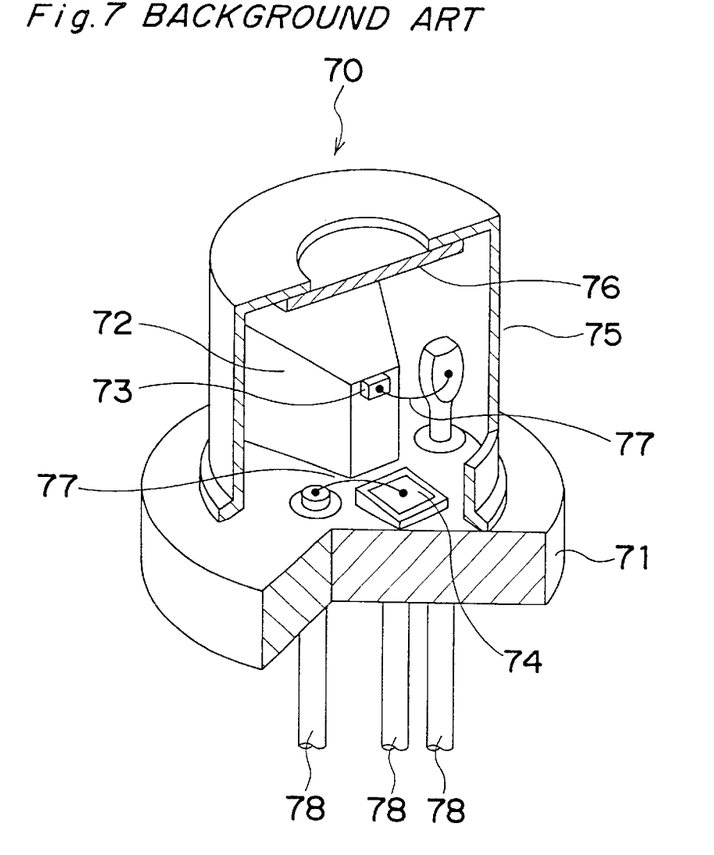
FIG. 7 is a cutaway diagram of a conventional semiconductor laser device.

FIG. 7 is a view explaining a conventional semiconductor laser device. In the shown semiconductor laser device 70, a semiconductor laser element 73 is mounted on a heat dissipation plate 72, which is integrated with a stem 71. The semiconductor laser element 73 and a monitoring photodetector 74 are connected to lead pins 78, 78 by metal wires 77, 77, respectively, the lead pins 78, 78 being electrically insulated from each other. Another lead pin 78 is connected to the stem 71, which pin is used as a common terminal of the semiconductor laser element 73 and the monitoring photodetector 74.

In order to protect the semiconductor laser element 73, the metal wires 77 and the like from mechanical impact and the like, a metal cap 75 provided with a glass window 76 that transmits laser beams is welded to the stem 71.

Figure 8:
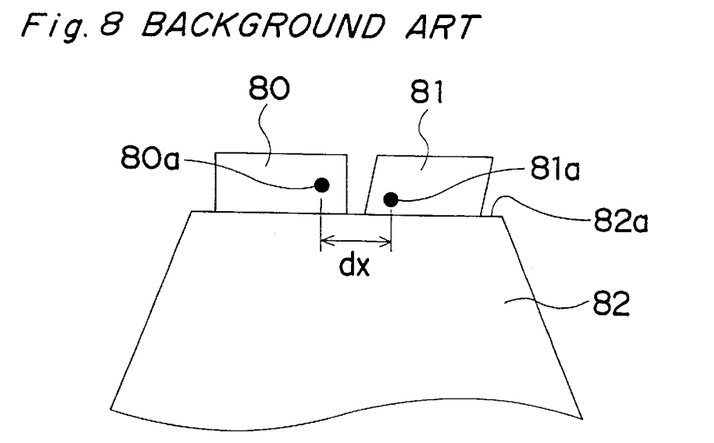
FIG. 8 is a view showing a main part of a hybrid-type semiconductor laser device.

FIG. 8 is a view of a main part of a hybrid-type semiconductor laser device seen from a laser beam emitting side of the device. This device is the same as the semiconductor laser device 70 of FIG. 7, except that two semiconductor laser elements 80, 81 are juxtaposed or disposed in parallel on a heat dissipation plate 82, and that these elements are individually connected to different lead pins (not shown) through metal wires (not shown).

The hybrid-type semiconductor laser device is characterized in that different semiconductor laser elements are freely combined. Generally, in the individual optical disc systems, an optical system is constructed on the basis of optical axes of laser beams. Therefore, the distance between adjacent optical axes should preferably be short, and moreover the distance between the adjacent optical axes should preferably be constant in the individual semiconductor laser devices. That is, in the case of the semiconductor laser device shown in FIG. 8 in which optical axes of the semiconductor laser elements 80, 81 are substantially parallel to waveguides (not shown) which pass through light emitting points 80a, 81a of the semiconductor laser elements and extend in a direction perpendicular to the surface of the drawing sheet, it is required that the distance dx between the light emitting points 80a, 81a be short and not changed among different semiconductor laser devices.

If the distance dx between optical axes is long, when an optical system is constructed such that a signal from one type of optical disc can be, detected, signals from other types of optical discs may not be detected. Further, when the distance between the optical axes is changed among the semiconductor laser devices, without a design change of the optical system or a substantial assembling adjustment made on the individual semiconductor laser devices, the following problems may occur: laser beams cannot be condensed accurately on an optical disc, signals cannot be read out, and so on. Thus, it becomes practically impossible to use such an optical system.

In order to shorten the distance dx between the adjacent light emitting points in the hybrid-type semiconductor laser device, for example, as shown in FIG. 8, it is required that the light emitting point 80a, 81a of each semiconductor laser element be positioned nearer to one side face of the semiconductor element than to the other side face. The reason thereof is as follows. The semiconductor laser element usually has a dimension in the range of 200 $\mu$m–300 $\mu$m in its widthwise or lateral direction i.e. a direction which is perpendicular to an extending waveguide of the semiconductor laser element and is parallel to a die bonding face 82a, while the distance dx between the light-emitting points of two semiconductor elements is required to be not more than 100 $\mu$m with an accuracy of about ±10 $\mu$m. Therefore, it is required that the distances from the light emitting points 80a, 81a to the respective side faces of the elements be not more than 50 $\mu$m. On the other hand, when the distance from the particular side face of the light emitting point of the semiconductor laser element is too short, for example 5 $\mu$m or less, there is a problem that its properties are deteriorated. For this reason, the position of the light emitting point must be arranged so as to be 5–50 $\mu$m distance from the side face.

Furthermore, in the hybrid-type semiconductor laser device, the light emitting points of the semiconductor laser elements are not centered. Thus, if an element is mounted in a wrong direction on the stem, the other element cannot be mounted, which is a problem. For example, if the semiconductor laser element 81 is wrongly oriented when mounted on the heat dissipation plate 82 based on the position of the light emitting point 80a of the other semiconductor laser element 80 on the heat dissipation plate 82, the opposed side faces of the semiconductor laser elements 80, 81 will bump against each other. Thus, the semiconductor laser element 81 cannot be mounted.

SUMMARY OF THE INVENTION

The present invention has been made with a view to solving the above problems, and an object of the present invention is to provide a semiconductor laser element having a light-emitting point positioned relative to a particular side face with high accuracy and free from mounting in a wrong direction such that use of the elements realizes a good hybrid-type semiconductor laser device, and also to provide a method of producing such a semiconductor laser element.

In order to accomplish the above object, the present invention provides a semiconductor laser element comprising a semiconductor substrate and a crystalline layer formed on a main surface of the semiconductor substrate, the crystalline layer having in its inside a waveguide, wherein the semiconductor laser element further comprises:

a light-emitting point alignment mark provided on an intersection line of an electrode surface of the semiconductor laser element with a plane which includes the waveguide and which is perpendicular to the electrode surface;

said light-emitting point alignment mark having a length in a width direction of the semiconductor laser element of not more than 20 μm; and a visually recognizable direction indicating mark.

With the above arrangement, in producing a hybrid-type semiconductor laser device using the semiconductor laser element of the present invention, it is possible to narrow the distance between two light emitting points of the semiconductor elements, without causing the opposed side faces of the semiconductor laser elements to bump against each other thanks to the direction indicating mark. Also, because the lateral positions (namely, positions in the width direction of the element) of the light emitting point and the light-emitting point alignment mark coincide with each other with a predetermined accuracy, it is possible to improve the accuracy of the distance between the side face and the light emitting point of the semiconductor laser element.

In order to facilitate the correct mounting of the semiconductor laser element, the direction indicating mark may be provided on the same side as the light-emitting point alignment mark in a direction in which the waveguide extends.

In one embodiment, the direction indicating mark consists of a polygon whose shortest side is longer than 20 μm or an ellipse whose minor axis is longer than 20 μm.

By this arrangement, it is possible to visually check the orientation of the semiconductor laser element, so that misorientation of the semiconductor laser element is avoided. This makes it possible to improve the productivity of semiconductor laser devices using the laser elements of the present invention.

The semiconductor laser element may further include a side alignment mark and an additional mark projecting laterally outwards of the side alignment mark. The additional mark may have a stepped shape such that the additional mark has various portions that are at different distances from a side face of the semiconductor laser element.

By this arrangement, the accuracy of the distance from the side face to the light emitting point of the semiconductor laser element can easily be evaluated, thus making it possible to improve the productivity more.

The present invention also provides a method of producing a semiconductor laser element comprising the steps of:

placing a photomask on a wafer, said photomask formed with a plurality of semiconductor laser element patterns each having a light-emitting point alignment mark and a side alignment mark;

adjusting widthwise distances between the light-emitting point alignment marks of the photomask and respective light emitting points in the wafer such that the distance falls within a predetermined range;

forming a plurality of semiconductor laser element patterns on the wafer using the photomask;

dividing the wafer into individual semiconductor laser elements; and judging whether each of the divided semiconductor laser elements is defective or non-defective by observing whether or not there is a missing part in the side alignment mark on the semiconductor laser elements.

This method can produce semiconductor laser elements having respective light-emitting points positioned at a required distance from pertinent side faces with accuracy. Also, with this method, defectives are easily found if any. Thus, it is possible to improve the productivity of the semiconductor laser elements.

In one embodiment, the step of adjusting widthwise distances between the light-emitting point alignment marks of the photomask and respective light emitting points in the wafer includes observing widthwise distances between the light-emitting point alignment marks of the photomask and respective waveguides in the wafer for the semiconductor laser elements to be produced.

Such an observation makes it possible to improve the accuracy of the distance between the light emitting point and the side face more.

The observation may be performed using an infrared microscope. The observation using an infrared microscope is convenient especially when an off-orientation wafer is used.

In one embodiment, the predetermined range for the widthwise distances between the light-emitting point alignment marks and the light-emitting points is from −10 μm to +10 μm.

In one embodiment, the plurality of semiconductor laser element patterns of the wafer are formed by etching a top layer of a multi-layered electrode layer of the wafer.

In one embodiment, each semiconductor laser element pattern of the photomask has an additional mark projecting laterally outwards of the side alignment mark in a stepped manner. In this case, each semiconductor laser element pattern of the wafer has an additional mark projecting laterally outwards of the side alignment mark in a stepped manner. Due to the additional mark projecting like steps or stairs, which can serve as a scale, it is possible to adequately adjust the position of a marking-off line for dividing the wafer.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 2A, 2B, 2C, 2D, 2E, 2F, 2G and 2H are explanatory views showing a process of producing the semiconductor laser element according to the first embodiment of the present embodiment, wherein FIG. 2C shows an enlarged view of a part 2C in FIG. 2B and FIG. 2H shows an enlarged view of a part 2H in FIG. 2A;

FIGS. 3 and 4 show other examples of the semiconductor laser element according to the first embodiment of the present invention, whose respective electrode patterns have direction indicating marks different from that shown in FIG.

1, wherein FIG. 3 shows a case where the direction indicating mark is circular, while FIG. 4 shows a case where the direction indicating mark is rectangular;

DETAILED DESCRIPTION OF THE PREFERRED EMBODIMENTS

The present invention will hereinafter be explained with reference to the accompanying drawings.
(First Embodiment)

Figure 1:
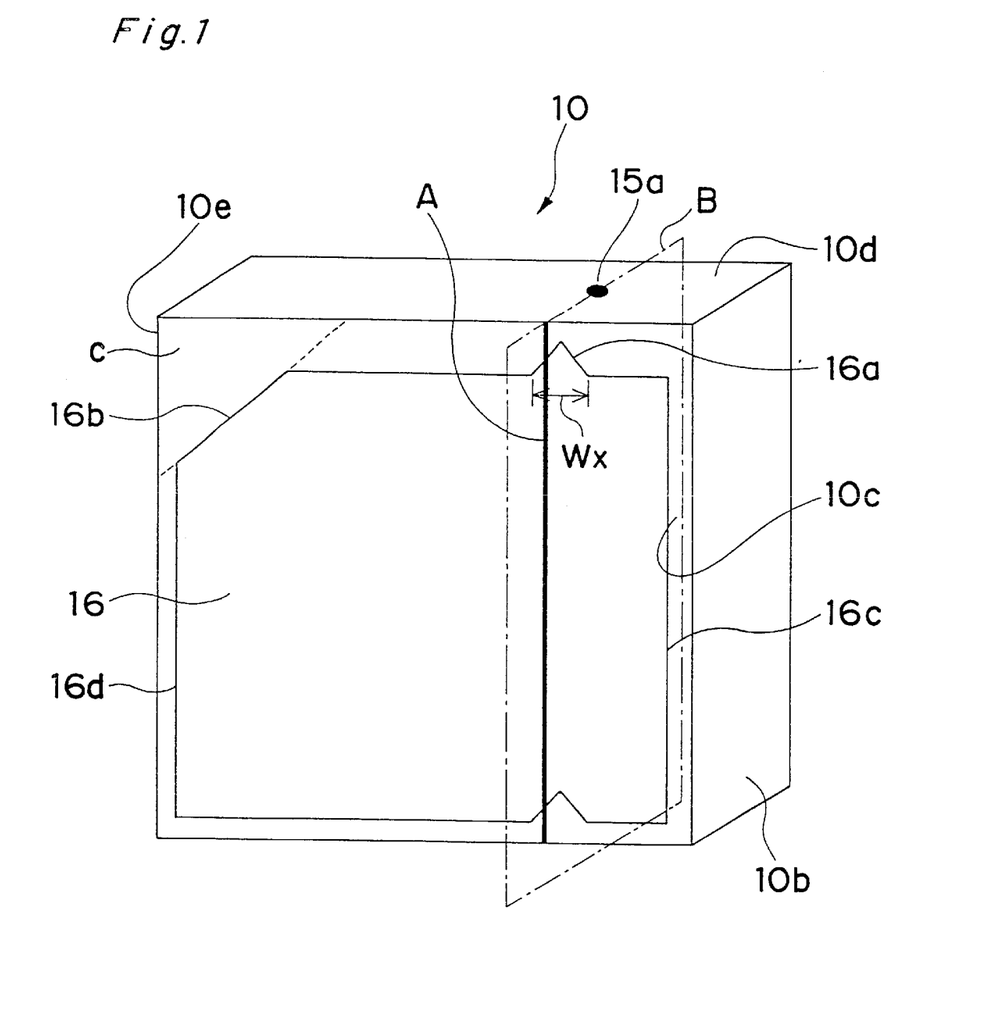
FIG. 1 is a perspective view of an example of the semiconductor laser element according to a first embodiment of the present invention seen from the direction of an electrode surface of the semiconductor laser element.

FIG. 1 is a perspective view of a semiconductor laser element 10 according to a first embodiment of the present invention seen from the side of an electrode surface 10c thereof. A light emitting point 15a is a point of intersection of an end face 10d of the semiconductor laser element 10 with a waveguide (not shown) that extends in a direction perpendicular to the end face 10d to the inside of the semiconductor laser element. An electrode pattern 16 defining a light-emitting point alignment mark 16a, side alignment marks 16c, 16d and a direction indicating mark C is provided on the electrode surface 10c of the element. The light-emitting point alignment mark 16a is directed toward the light emitting point 15a and overlaps an intersection line A of a plane B that includes the waveguide (not shown) and is perpendicular to the electrode surface 10c, with the electrode surface 10c. The widthwise length Wx of the light-emitting point alignment mark 16a is set to 20 μm by way of example. Further, the side alignment marks 16c and 16d of adjacent electrode patterns (see FIG. 2E) are spaced 10 μm apart.

The direction indicating mark C is constituted of a triangle defined by a slant edge 16b of the electrode pattern 16 (the slant edge 16b being obtainable by cutting a corner portion of a generally rectangular electrode pattern), extensions of the slant edge 16b, and parts of edges of side faces 10d and 10e of the semiconductor laser element. The shortest edge or side of the triangular direction indicating mark C is defined by the part of the edge of the side face 10d or 10e of the semiconductor laser element. In the semiconductor laser element 10 of the present embodiment, the length of the shortest side of the direction indicating mark C is set to 30 μm. As far as the length of the shortest side is set to more than 20 μm, the direction indicating mark C is visually recognizable. Accordingly, it is possible to easily confirm the end face 10d having the light emitting point 15a.

On the other hand, the side alignment marks 16c and 16d consist of edges of the electrode pattern 16 extending alongside of the corresponding side faces 10b and 10e of the semiconductor laser element, respectively. A semiconductor laser element in which the distance between the side alignment mark 16c and the side face 10b and the distance between the side alignment mark 16d and the side face 10e are both between 0 and 10 μm is judged to be non-defective. Whether the semiconductor laser element is defective or non-defective is examined by judging whether or not there is a broken or chipped portion in the side alignment mark 16c or 16d, namely, whether the side alignment marks 16c and 16d are complete or not, through observation using a low magnification microscope and the like.

FIGS. 2A–2H are views showing process steps for producing a semiconductor laser element according to the embodiment of the present embodiment.

Figure 2A:
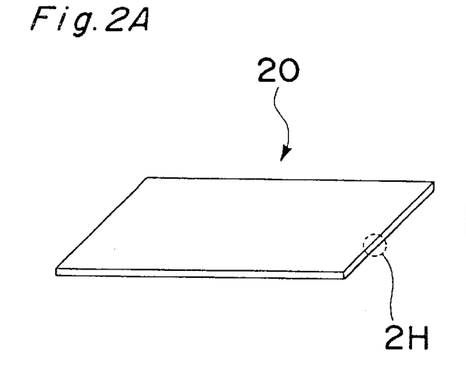
Figure 2B:
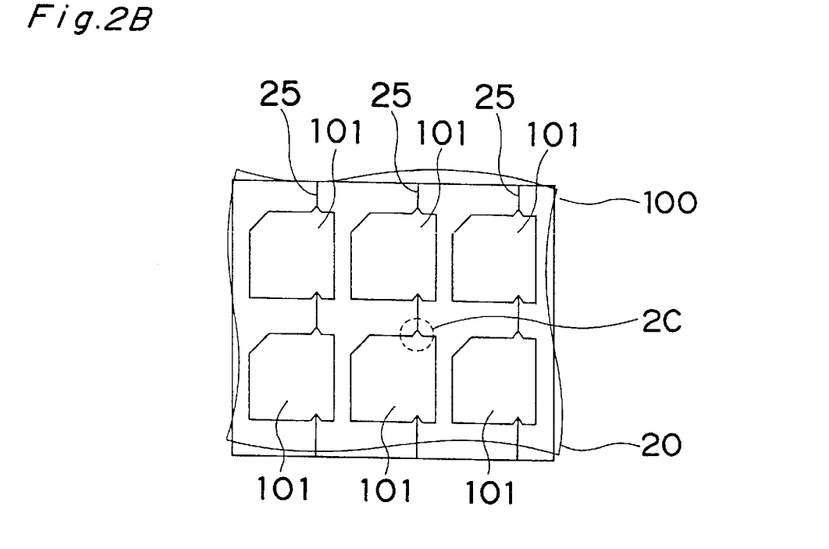
Figure 2C:
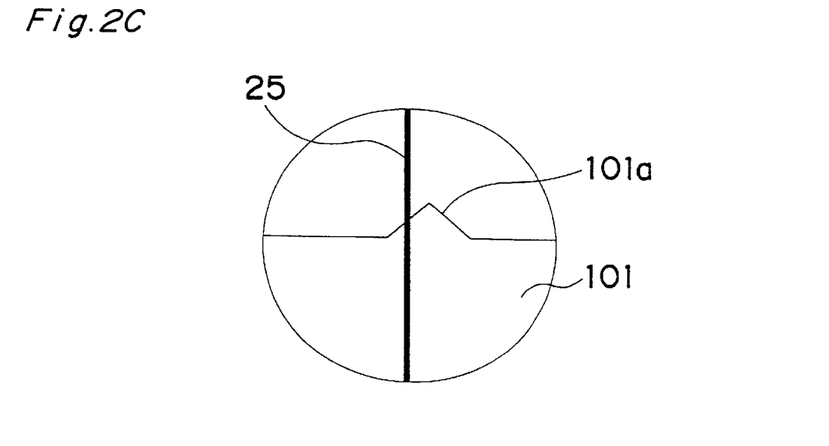
Figure 2D:
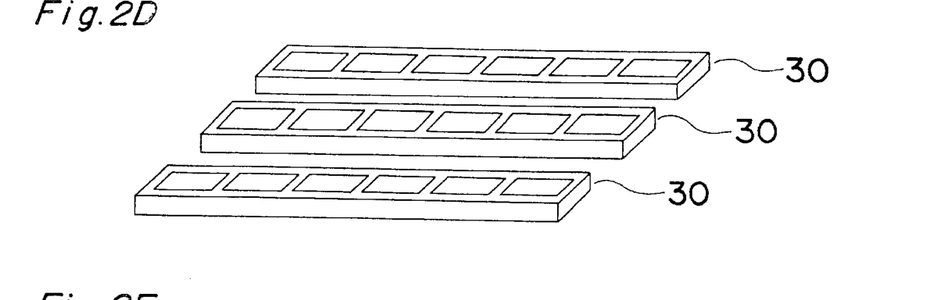
Figure 2E:
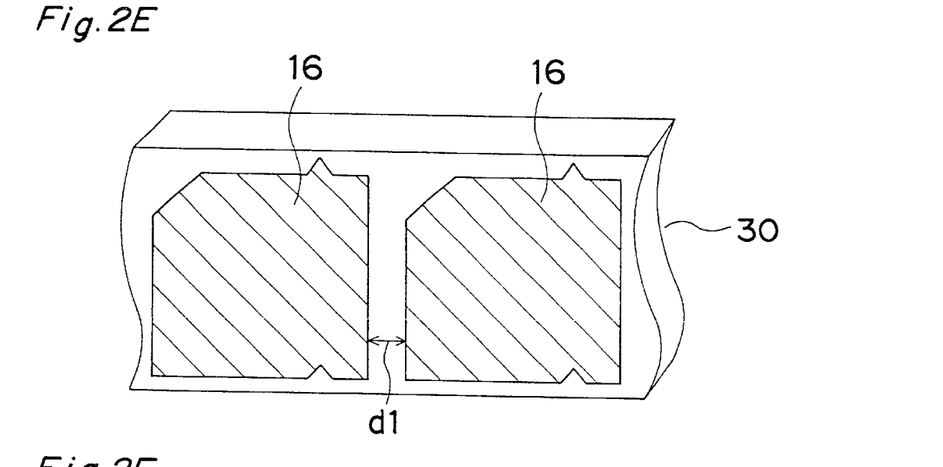
Figure 2F:
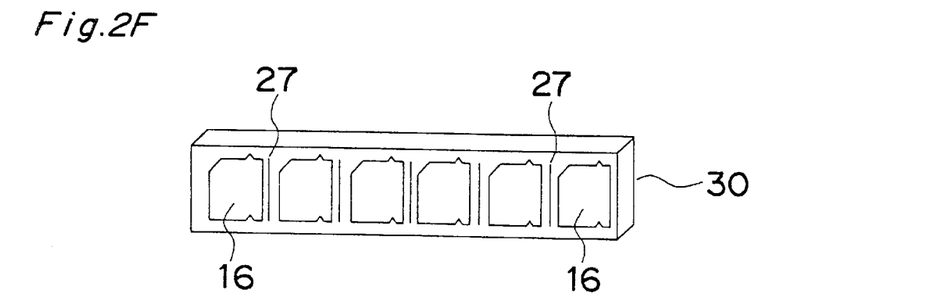
Figure 2G:
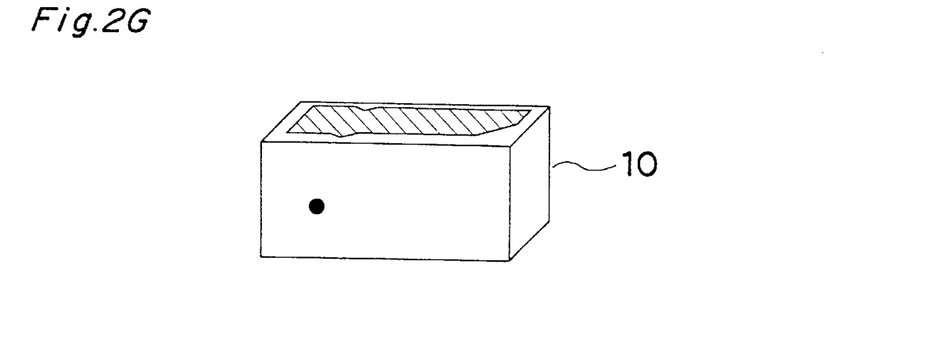
Figure 2H:
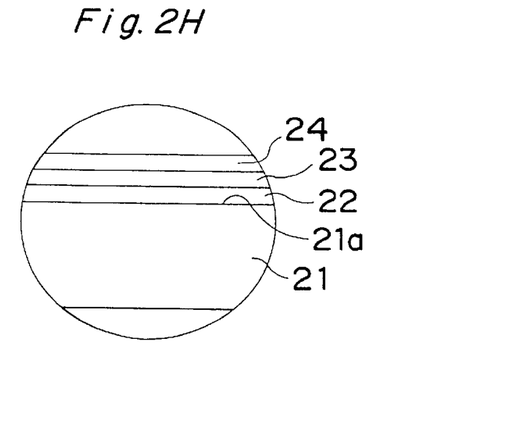

First, as shown in FIGS. 2A and 2H, a wafer 20 is fabricated in which a crystalline layer 22 consisting of a plurality of layers including cladding layers, an active layer and a cap layer is laid on a main surface 21a of a semiconductor substrate 21.

Next, a multi-layered electrode layer 23 including an aluminum (Al) top layer is formed on the crystalline layer 22 by vacuum vapor deposition and the like. At this time, the electrode layer 23 is not deposited on edge portions of the wafer 20. Then, a resist 24 is applied onto the electrode layer 23. In the same manner as in an ordinary photolithography, a photomask 100 formed with electrode patterns 101 is placed directly on the resist 24-applied face of the wafer 20 as shown in FIG. 2B.

FIG. 2C shows an enlarged view of a part 2C of FIG. 2B, illustrating a region of a light-emitting point alignment mark 101a provided to the electrode pattern 101 of the photomask 100. Since the position of the waveguide (not shown) can be seen in the form of a linear stripe 25 that coincides with the intersection line A on the surface of the wafer 20, the photomask 100 is adjusted such that the light-emitting point alignment mark 101a of the photomask coincides in position with the stripe 25. It is easier to observe the linear stripe 25 at an edge portion of the wafer 20 where there is no electrode layer 23.

While checking the alignment condition using a plurality of electrode patterns 101, alignment adjustment is made such that the direction in which a column of light-emitting point alignment marks 101a extends coincides with high accuracy with the direction in which the corresponding linear stripe 25 extend. By this adjustment, the light-emitting point alignment marks 101a are brought into alignment with the waveguides (not shown). If such adjustment is carried out on both of the edge portions of the wafer 20 where the electrode layer is not formed, positioning of the electrode patterns 101 can be performed with higher accuracy in the entire region of the wafer 20.

After completion of the adjustment, the resist 24 is irradiated with ultraviolet rays through the photomask 100 and then developed so as to form a resistmask (not shown). Using as a mask the resistmask (not shown), the top Al layer of the electrode layer 23 is etched by so-called hot phosphoric acid, namely phosphoric acid heated to about 70° C., or the like so as to form electrode patterns 26.

After polishing or grinding this wafer 20 on the substrate 21 side to thin the wafer 20 to a thickness of about 100 μm, an electrode is formed on the ground surface and then the wafer 20 is cleaved along its crystal planes. As a result, laser bars 30, 30, 30 as shown in FIG. 2D are made. FIG. 2E is an enlarged view showing a part of the laser bar 30. Electrode patterns 16, 16 are arrayed in the widthwise direction at equal intervals. The distance d1 between adjacent electrode patterns 16, 16 is set to 10 μm.

Lastly, as shown in FIG. 2F, scratched marking-off lines 27 are given to each laser bar between the adjacent electrode patterns 16 . . . 16 and then the bars are pressed to be divided. In this way, a plurality of semiconductor laser elements 10 as shown in FIG. 2G and FIG. 1 are produced. It is apparent that if the scratched marking-off lines 27 do not overlap with the electrode patterns 16, the side alignment mark 16c and the side alignment mark 16d are spaced 0 to 10 μm from the side face 10b and the side face 10e, respectively. For that reason, it is possible to judge the elements to be defective or non-defective by observing whether or not there is a chipped or missing portion in the side alignment mark 16c or 16d, namely, whether both the side alignment marks 16c and 16d are complete.

If the widthwise length of the light-emitting point alignment mark 101a of the photomask is set to 22 μm, the widthwise length Wx of the light-emitting point alignment mark 16a of the completed electrode 16 is to be about 20 μm. Since the lateral position of the light emitting point 15a falls within this range, the light emitting point 15a is positioned at a distance in the range of ±10 μm relative to a lateral center of the light-emitting point alignment mark 16a, where the positive sign + indicates that the light emitting point 15a is positioned on the side farther from the side surface 10b than the lateral center of the mark 16a, while the negative sign − indicates that the light emitting point 15a is positioned on the side closer to the side surface 10b than the lateral center of the mark 16a. On the other hand, since the distance between the side alignment mark 16c and the side face 10b is between 0 and 10 μm, if the distance between the lateral center of the light-emitting point alignment mark 16a and the side alignment mark 16c is set to 30 μm, then the distance between the light emitting point 15a and the side face 10b becomes 20–50 μm. Therefore, it is understood that the accuracy required is achieved.

By judging those laser elements in which either side alignment mark is partially or entirely missing, which is attributed to insufficient positioning accuracy of marking-off lines, to be defective, there will not occur a problem of shipping such defectives in which the distance between the light emitting point and the side face does not satisfy the specification.

The above-mentioned measures makes it possible to fabricate a semiconductor laser element in which the distance from a side face of the semiconductor laser element to a light emitting point is adjusted with high accuracy. An improvement in the positioning accuracy of the light emitting point in the semiconductor laser element itself is important when it is necessary to adjust positions of light emitting points of two semiconductor laser elements with high accuracy as in a hybrid-type semiconductor laser device. Further, in the case of narrowing the distance between the two light emitting points, it is necessary to reduce the distance between the light emitting point and a side face of each semiconductor laser element. In this case as well, it is important to improve the positioning accuracy of the light emitting points.

Furthermore, the direction indicating mark C prevents the semiconductor laser element 10 to be placed on a mount in a wrong direction. Therefore, when placing two or more semiconductor laser elements 10 on a common mount, the aforementioned problem of bumping of the semiconductor laser elements at the side faces will not occur.

Figure 3:
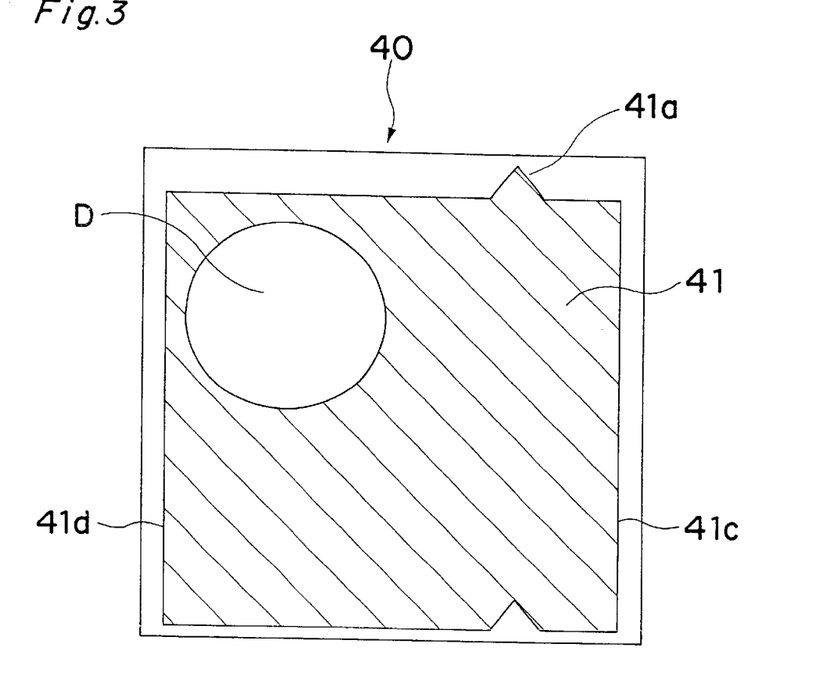
Figure 4:
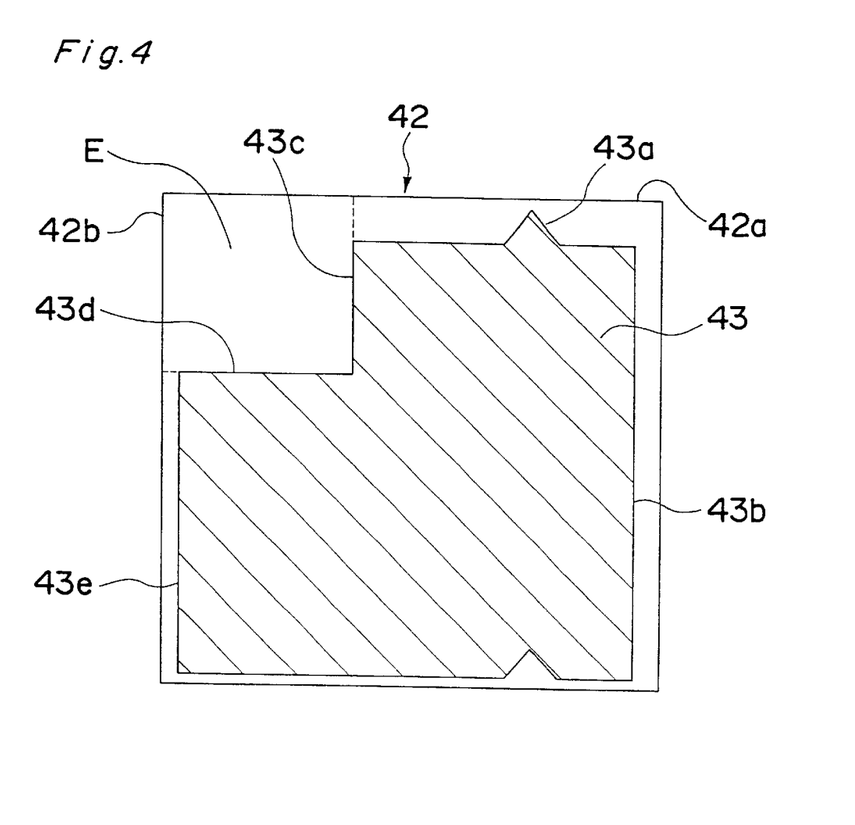

For the direction indicating mark, a shape shown in FIG. 3 or 4 may be applied in addition to the triangular shape obtained by cutting a corner portion of the electrode pattern.

FIG. 3 shows an example 40 of a semiconductor laser element in which a part having a circular shape is removed from an Al top layer of an electrode pattern 41. The circular part serves as a direction indicating mark D. If the diameter of the direction indicating mark D is larger than 20 μm, it is possible to visually recognize the mark D. If the direction indicating mark is an ellipse, it is possible to visually recognize the mark when the minor axis is longer than 20 μm. In the similar manner as above, the semiconductor laser element 40 is also provided with a light-emitting point alignment mark 41a, and side alignment marks 41c, 41d.

FIG. 4 shows an example 42 of a semiconductor laser element in which a corner portion of a top Al layer of an electrode pattern 43 is removed in a rectangular shape. The rectangular part serves as a direction indicating mark E. In this case, a part surrounded by sides 42a, 42b of the semiconductor laser element 42 and sides 43c, 43d of the electrode pattern 43 and their extensions is recognized as a square when viewing the entire electrode surface of the semiconductor laser element. And, the square is visually recognizable as a direction indicating mark E if the length of each of the sides of the square is set to more than 20 μm. Similarly to the above-described semiconductor laser elements, the semiconductor laser element 42 is also provided with a light-emitting point alignment mark 43a, and side alignment marks 43b, 43e.

Figure 5:
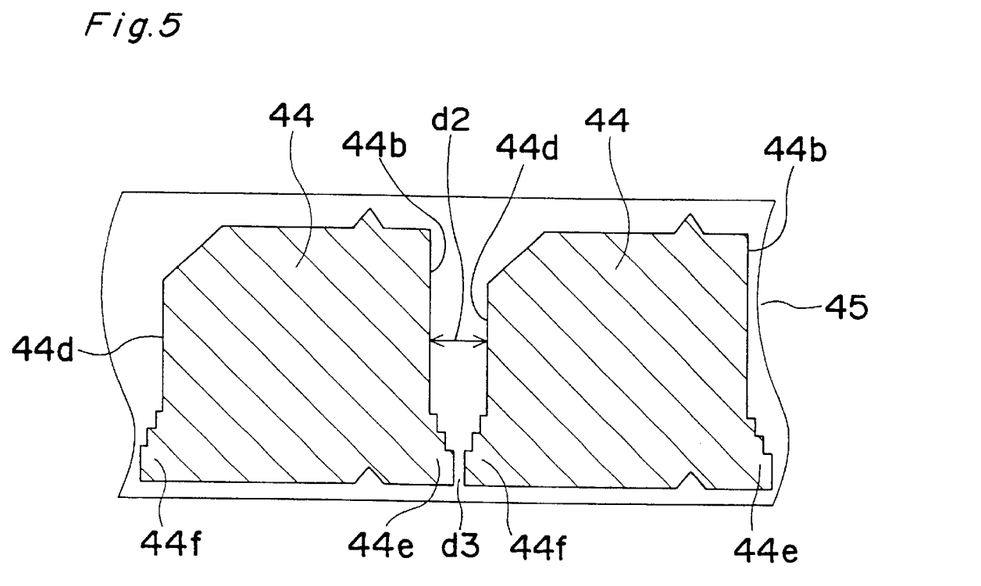
FIG. 5 is a view showing a laser bar of another example of the semiconductor laser elements according to the first embodiment of the present invention, in which the electrode pattern has side alignment marks different from those shown in FIG. 1.

FIG. 5 is an enlarged view of a part of a laser bar 45 formed with other side alignment marks. In order to produce elements in each of which the distance between a side alignment mark and a corresponding side face has been adjusted with high accuracy, side alignment marks 44b, 44d of each electrode pattern 44 are provided with respective additional parts 44e, 44f which project from the side alignment marks proper 44b, 44d laterally outwards in a stepped manner and serve as additional marks. Due to these stepped projections 44e and 44f, it is possible to know whether and how much the marking-off line is displaced from a predetermined position. Thus, if there is a displacement of the marking-off line, the displacement can be corrected. Also, if the distance d2 between the adjacent side alignment marks proper 44b and 44d is set to 10 μm, if the distance d3 between the opposed most projecting portions of the additional parts 44e and 44f of the adjacent side alignment marks 44b and 44d is set to 5 μm, and if the lateral distance from the lateral center of the light-emitting point alignment mark to the most projecting portion of the additional part 44e of the side alignment mark 44b is set to 30 μm, then the distance from the light emitting point to a side face (a side face adjacent to the side alignment mark 44b) in a completed laser element falls within a range of 20–45 μm when a scratched marking-off line does not overlap the side alignment mark 44b or 44d, resulting in higher accuracy. In this embodiment, as far as the marking-off line (not shown in FIG. 5) does not overlap the side alignment mark proper 44b or 44d, the completed laser element is regarded as being non-defective even if the marking-off line overlaps the additional part 44e or 44f.

(Second Embodiment)

Figure 6:
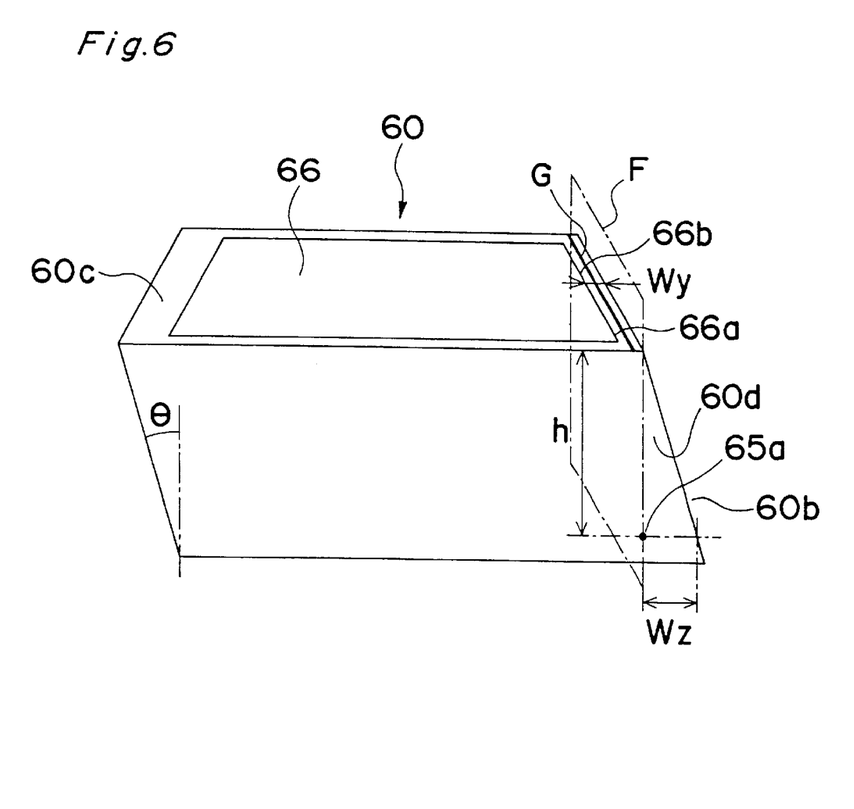
FIG. 6 is a perspective view of a semiconductor laser element according to a second embodiment of the present invention seen from the direction of an end face of the semiconductor laser element.

FIG. 6 is a perspective view of a semiconductor laser element 60 according to a second embodiment of the present invention seen from an end face 60d side.

In the semiconductor laser element 60 according to the present embodiment, an off-orientation wafer in which a main face is oriented at an angle of θ (15°) from a (1 0 0) plane toward a [0 1 1] direction. In order to make the distance Wz between a light emitting point 65a and a side face 60b as short as possible, a corner portion of an electrode pattern 66 also serves as a light-emitting point alignment mark 66a.

When using a so-called off-orientation wafer in which its main face is oriented at an angle of θ (15°) from the (1 0 0) face toward the [0 1 1] direction, the light-emitting point alignment mark 66a is made to coincide with an intersection line G of an electrode surface 60c and a plane F that includes the light emitting point 65a and is perpendicular to the end face 60d.

In the case where the off-orientation substrate is used, since the linear stripes corresponding to the waveguides described in the first embodiment cannot be used, waveguides are observed using an infrared microscope. Since a wafer (see 20 in FIG. 2A) using a GaAs substrate transmits infrared rays, it is possible to directly observe the waveguides in the inside of the wafer. Accordingly, it is possible to make the waveguides coincide with light-emitting point alignment marks of a photomask while directly observing the waveguides.

The accuracy of the lateral distance between the light-emitting point alignment mark 66a and the light emitting point 65 is ±10 μm, while the distance Wy between the side alignment mark 66b and the side face 60b is from 0–10 μm. Since the distance h between the light emitting point 65a and the electrode surface 60c is about 100 μm, the lateral distance Wz between the side face 60b and the light emitting point 65a is 17–47 μm. Thus, it turns out that the semiconductor laser element 60 of the present embodiment also satisfies the required accuracy.

Needless to say, the semiconductor laser element 60 of the second embodiment may also be provided with a direction indicating mark. Further, a side alignment mark may be provided with an additional mark that extends laterally outwards from the side alignment mark in a stepped manner (see FIG. 5). It is a matter of course that various modifications can be made unless they deviate from the scope of the present invention.

As described above, by using the semiconductor laser element and the method of producing the same according to the present invention, a required distance between the light emitting point and a side face is obtainable with high accuracy. Therefore, it is possible to mount a plurality of semiconductor laser elements together in one semiconductor laser device, with light emitting points of adjacent semiconductor laser elements set close to each other with high accuracy.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser element comprising a semiconductor substrate and a crystalline layer formed on a main surface of the semiconductor substrate, the crystalline layer having in its inside a waveguide, wherein the semiconductor laser element further comprises:

a light-emitting point alignment mark partly overlapping an intersection line defined by the intersection of an electrode surface of the semiconductor laser element with a plane which includes the waveguide, the plane of the waveguide being perpendicular to the electrode surface;

said light-emitting point alignment mark having a length in a width direction of the semiconductor laser element of not more than 20 μm; and a visually recognizable direction indicating mark provided on the electrode surface.

2. The semiconductor laser element according to claim 1, wherein the direction indicating mark is provided on the same side as the light-emitting point alignment mark in a direction in which the waveguide extends.

3. The semiconductor laser element according to claim 1, wherein the direction indicating mark consists of a polygon whose shortest side is longer than 20 μm or an ellipse whose minor axis is longer than 20 μm.

4. The semiconductor laser element according to claim 1, further comprising a side alignment mark and an additional mark projecting laterally outwards of the side alignment mark.

5. The semiconductor laser element according to claim 4, wherein the additional mark has a stepped shape such that the additional mark has various portions that are at different distances from a side face of the semiconductor laser element.

* * * * *